United States Patent
Stadius

(10) Patent No.: US 7,268,640 B2
(45) Date of Patent: Sep. 11, 2007

(54) FREQUENCY GENERATOR ARRANGEMENT

(75) Inventor: Kari Rainer Stadius, Helsinki (FI)

(73) Assignee: Nokia Corporation, Espoo (FI)

( * ) Notice: Subject to any disclaimer, the term of this patent is extended or adjusted under 35 U.S.C. 154(b) by 85 days.

(21) Appl. No.: 11/312,327

(22) Filed: Dec. 20, 2005

(65) Prior Publication Data

US 2007/0139124 A1    Jun. 21, 2007

(51) Int. Cl.
*H03C 3/00* (2006.01)
(52) U.S. Cl. .................. 332/117; 332/127; 455/260; 455/323; 455/315; 375/307; 375/295; 331/2; 331/46
(58) Field of Classification Search ................ 455/260, 455/323, 313, 315; 332/117, 127; 375/307, 375/295; 331/2, 46
See application file for complete search history.

(56) References Cited

U.S. PATENT DOCUMENTS 5,307,029 A * 4/1994 Schenk ..................... 331/37

FOREIGN PATENT DOCUMENTS

| EP | 1 469 373 | 10/2004 |
|---|---|---|
| WO | 2005/074152 | 8/2005 |
| WO | 2006/065031 | 6/2006 |

OTHER PUBLICATIONS

Batra A. et al., "Design of a Multiband OFDM System for Realistic UWB Channel Environments", IEEE Trans. On Microwave Theory Techniques, vol. 52, No. 9, Sep. 2004, pp. 2123-2138.

* cited by examiner

*Primary Examiner*—Arnold Kinkead
(74) *Attorney, Agent, or Firm*—Hollingsworth & Funk, LLC

(57) ABSTRACT

A frequency generator is provided. The generator comprises two voltage controlled oscillators generating a first signal of a given multiple of a predetermined raster frequency, and a second signal of another given multiple of a predetermined raster frequency, dividers dividing the output signal of the oscillator until the frequency of both divided output signals is equal to the raster frequency, a filter arrangement connected to the output of the dividers, and a single sideband mixer. The mixer produces as output a signal having a frequency which is equal to the frequency of the output signal of either one of the oscillators or to the frequency of the output signal of either one of the oscillators from which the output signal of the filter arrangement has been subtracted or to which the output signal of the filter arrangement has been added.

11 Claims, 2 Drawing Sheets

FREQUENCY GENERATOR ARRANGEMENT

FIELD

The invention relates to generating frequencies in a transceiver and more specifically to generating carrier frequencies with fast frequency hopping capability.

BACKGROUND

Frequency hopping is a technique in which the frequency, typically a carrier frequency, is varied during transmission of data. Frequency hopping has been used in radio communication systems to reduce interference, for example. Frequency hopping may also be used as a modulating method.

Recently communication systems requiring fast frequency hopping capability have been proposed. An example of such a system is an ultra wideband communication system employing OFDMA (Orthogonal Frequency Division Multiple Access) developed by the IEEE 802.15.3 standardization body. In such a system, the required hopping rates may be up to 3 MHz.

Conventional phase locked loop based frequency synthesizers are not able to settle into the desired frequency fast enough. A prior art solution is proposed in A. Batra et al, "Design of a Multiband OFDM System for Realistic UWB Channel Environments", IEEE Trans. on Microwave Theory and Techniques, vol. 52, No. 9, September 2004. By using a fixed frequency source and a set of frequency dividers it is possible to generate a set of tones, which can then be mixed using a conventional analog mixer, for generating the desired local oscillator (LO) frequency. Fast frequency selection is achieved by switching the selected mixing tones. The prior art solution has several drawbacks. One drawback is the poor spectral purity of the generated LO frequency: harmonics of the low frequency mixing tones are not properly attenuated and they contaminate the generated LO tone with undesired adjacent tones. In addition, the solution requires two single-sideband mixer blocks which leads to high power consumption and a large die area. Furthermore, the prior art generator can generate frequencies of only one band group of the band groups allocated for the IEEE 802.15.3 system.

BRIEF DESCRIPTION OF THE INVENTION

An object of the invention is to provide an improved solution for frequency generation. According to an aspect of the invention, there is provided a frequency generator arrangement, comprising a first voltage controlled oscillator generating a first oscillator signal of a given multiple of a predetermined raster frequency, a second voltage controlled oscillator generating a second oscillator signal of another given multiple of a predetermined raster frequency, one or more dividers connected to the output of each oscillator, dividing the output signal of the oscillator until the frequency of both divided output signals is equal to the raster frequency, a filter arrangement performing a low pass filtering on the signal at the output of the one or more dividers, and a single sideband mixer, having as input the output signals of the oscillators and the output signal of the filter arrangement, the mixer producing as output a signal having a frequency which is equal to the frequency of the output signal of either one of the oscillators or to the frequency of the output signal of either one of the oscillators from which the output signal of the filter arrangement has been subtracted or to which the output signal of the filter arrangement has been added.

According to another aspect of the invention, there is provided a radio transceiver comprising a frequency generator arrangement comprising a first voltage controlled oscillator generating a first oscillator signal of a given multiple of a predetermined raster frequency, a second voltage controlled oscillator generating a second oscillator signal of another given multiple of a predetermined raster frequency, one or more dividers connected to the output of each oscillator, dividing the output signal of the oscillator until the frequency of both divided output signals is equal to the raster frequency, a filter arrangement performing a low pass filtering on the signal at the output of the one or more dividers, and a single sideband mixer, having as input the output signals of the oscillators and the output signal of the filter arrangement, the mixer producing as output a signal having a frequency which is equal to the frequency of the output signal of either one of the oscillators or to the frequency of the output signal of either one of the oscillators from which the output signal of the filter arrangement has been subtracted or to which the output signal of the filter arrangement has been added.

According to another aspect of the invention, there is provided a method for generating frequencies, the method comprising: generating a first oscillator signal in a first voltage controlled oscillator, the frequency of the first oscillator signal being a given multiple of a predetermined raster frequency, generating a second oscillator signal in a second voltage controlled oscillator, the frequency of the second oscillator signal being another given multiple of a predetermined raster frequency, dividing the output signal of each oscillator in one or more dividers connected to the output of each oscillator until the frequency of both divided output signals is equal to the raster frequency, performing a low pass filtering on the signal at the output of the one or more dividers in a filter arrangement, processing the output signals of the oscillators and the output signal of the filter arrangement in a single sideband mixer, the mixer producing as output a signal having a frequency which is equal to the frequency of the output signal of either one of the oscillators or to the frequency of the output signal of either one of the oscillators from which the output signal of the filter arrangement has been subtracted or to which the output signal of the filter arrangement has been added.

According to yet another aspect of the invention, there is provided a method for generating frequencies, the method comprising: selecting a voltage controlled oscillator from at least two voltage controlled oscillators, on the basis of the band of frequencies to be generated, generating an oscillator signal in the selected voltage controlled oscillator, the frequency of the oscillator signal being a given multiple of a predetermined raster frequency, dividing the output signal of the oscillator in one or more dividers connected to the output of the oscillator until the frequency of the divided output signal is equal to the raster frequency, performing a low pass filtering on the signal at the output of the one or more dividers in a filter arrangement, processing the output signal of the oscillator and the output signal of the filter arrangement in a single sideband mixer, the mixer producing as output a signal having a frequency which is equal to the frequency of the output signal of the oscillator or to the frequency of the output signal of the oscillator from which the output signal of the filter arrangement has been subtracted or to which the output signal of the filter arrangement has been added.

The invention provides several advantages. The proposed frequency generator may be used in applications requiring very fast hopping rates. For example, the 3 MHz hopping rate of Ultra Wideband OFDMA systems is achievable.

In the proposed generator, fixed frequency mixing tones and single-sideband mixing is utilized for LO tone generation. However, compared to prior art only one single-sideband mixer is needed. This reduces power consumption and the size of the generator. Furthermore, only one low frequency mixing tone is generated and filtering is used for attenuating its harmonics. Therefore, the final signal spectrum has a significantly better spectral purity compared to previous solutions.

In addition, the proposed frequency generator is able to produce frequencies of more than one different band group of the band groups allocated for the IEEE 802.15.3 system. For example, band groups one and band group three may be generated using a single phase locked loop and two voltage controlled oscillators (VCO) and consecutive frequency dividers. In prior art solutions, a separate generator is required for each band. In the proposed solution, band group selection may be performed by activating the corresponding VCO and frequency divider. Switching from band group to another one has no critical time requirement since band groups are used in different environments.

LIST OF DRAWINGS

In the following, the invention will be described in greater detail with reference to the embodiments and the accompanying drawings, in which FIG. 1 illustrates band groups of an UWB OFDM system;

DESCRIPTION OF EMBODIMENTS

Embodiments of the invention may be used for example in communication systems where very fast frequency hopping is utilized. In the following, embodiments of the invention are described using ultra wideband (UWB) OFDMA system as an example. However, the invention is not limited to such a system, as one skilled in the art is aware.

Figure 1:
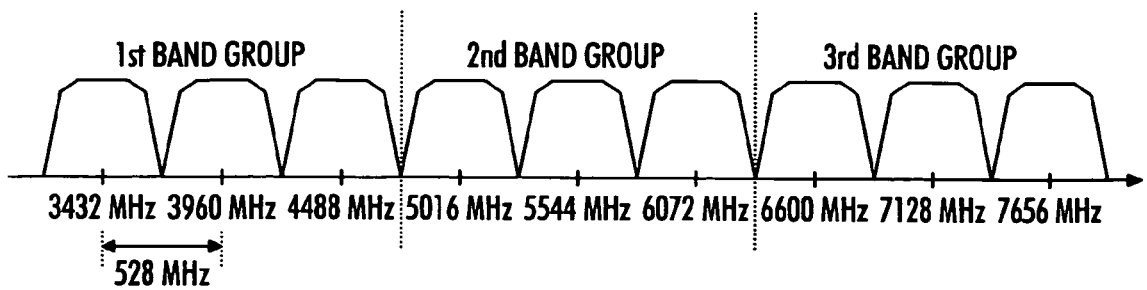

In the UWB OFDMA system developed by the IEEE 802.15.3 standardization body, the spectrum allocated for the system is divided into 14 bands. The bands are spaced 528 MHz from each other. The bands are divided into five band groups. Thus, each band group comprises three bands. FIG. 1 illustrates first three band groups. As an example, the frequency bands of each band and the center frequencies of each of the first and third band groups are defined in Table 1.

TABLE 1

| Band Group | Band | Frequency band | Center frequency |
|---|---|---|---|
| 1 | 1 | 3168-3696 MHz | 3432 MHz |
|  | 2 | 3696-4224 MHz | 3960 MHz |
|  | 3 | 4224-4752 MHz | 4488 MHz |

TABLE 1-continued

| Band Group | Band | Frequency band | Center frequency |
|---|---|---|---|
| 3 | 7 | 6336-6864 MHz | 6600 MHz |
|  | 8 | 6864-7392 MHz | 7128 MHz |
|  | 9 | 7392-7920 MHz | 7656 MHz |

In an embodiment, a UWB radio transceiver uses the above two band groups for transmission. When the transceiver is transmitting using a band group, it utilizes frequency hopping with very fast hopping rates. Thus, when band group 1 is used for transmission, the transceiver hops between bands 1, 2 and 3. When band group 3 is used for transmission, the transceiver hops between bands 7, 8 and 9. The OFDM symbols are time-interleaved across the used band. The transmitter may switch to another band group but this transition may take a longer time.

In the transceiver, the center frequency of the band to be used is generated by a frequency generator.

Figure 2A:
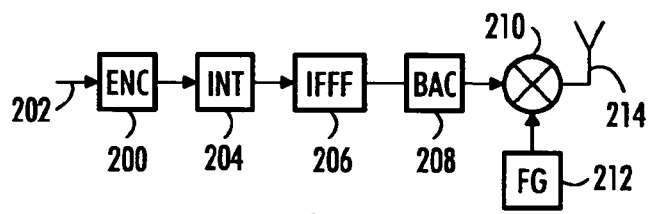
FIG. 2A illustrates an example of the structure of a UWB OFDMA transmitter.

FIG. 2A illustrates an example of the structure of a UWB OFDMA transmitter. The presented structure is a simplified example of a possible transmitter. An actual transmitter may also comprise other components, as one skilled in the art is aware. The transmitter comprises an encoder 200 which convolutionally encodes the input signal 202. The encoded signal is interleaved in an interleaver 204.

The interleaved signal is mapped onto OFDM subcarriers using an IFFT (inverse Fast Fourier Transform) in an IFFT unit, 206 which transforms the signal into time domain. In the IFFT unit a cyclic prefix (CP) is added to the signal to reduce the intersymbol interference (ISI). Finally, the signal is converted to an analogue format in converter 208.

The analogue signal is taken to a mixer 210, where each OFDM symbol of the signal is transferred to the desired center frequency. The frequency generator 212 generates the required center frequencies. The obtained RF signal is transmitted using an antenna 214.

Figure 2B:
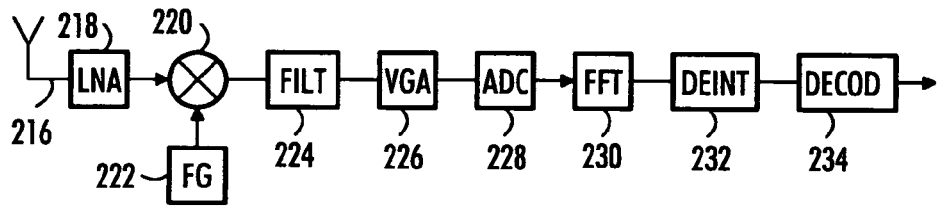
FIG. 2B illustrates an example of the structure of a UWB OFDMA receiver.

FIG. 2B illustrates an example of the structure of a UWB OFDMA receiver. The presented structure is a simplified example of a possible receiver. An actual receiver may also comprise other components, as one skilled in the art is aware. The receiver receives a signal with an antenna 216. The received signal is amplified in a low noise amplifier 218 and converted to base band in the mixer 220, where the signal is multiplied by a center frequency signal obtained from a frequency generator 222. From the mixer 220 the signal is taken to a low pass filter 224, an amplifier 226 and a converter 228, where the signal is converted into a digital form. The digitized signal is forwarded to an FFT unit 230, where a Fast Fourier Transform converts the signal into frequency domain. From the FFT unit 230 the signal is taken to a deinterleaver 232 and a decoder 234.

The transmitter and the receiver may be combined into a single transceiver.

Figure 3:
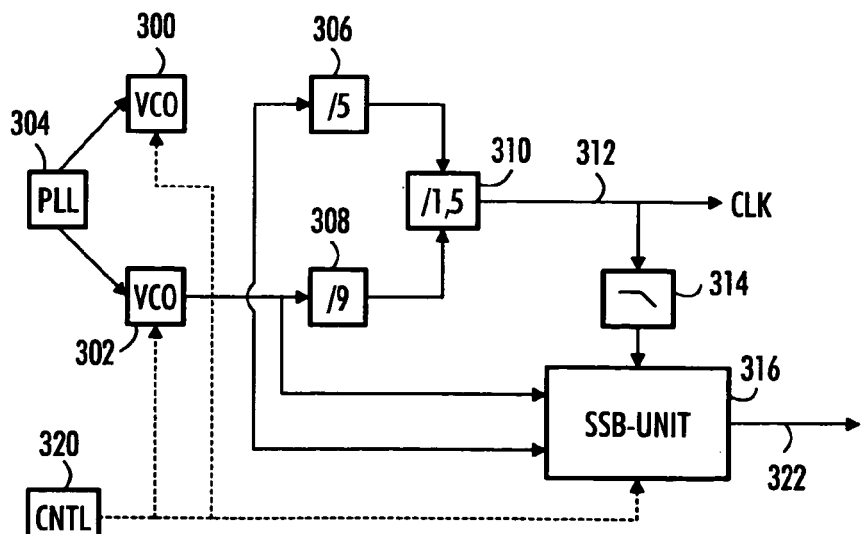
FIG. 3 illustrates an example of the structure of a frequency generator arrangement.

The frequency generators 212, 222 generate the required center frequencies. FIG. 3 illustrates an example of the structure of a frequency generator arrangement. FIG. 3 illustrates a frequency generator arrangement for the system developed by the IEEE 802.15.3 standardization body. The frequency generator arrangement is configured to generate frequencies from the band groups one and band group three. In this system, the raster frequency fr is 528 MHz.

The arrangement comprises two voltage-controlled oscillators (VCO) 300, 302 and a phase locked loop 304 setting and maintaining the correct VCO frequency. In this embodiment, the first VCO 300 produces a frequency 3960 MHz (which equals 7.5*fr). This corresponds to the center frequency of the middle band in the first band group. The second VCO 302 produces a frequency 7128 MHz (which equals 13,5*fr). This corresponds to the center frequency of the middle band in the third band group. In an embodiment, the first and the second voltage controlled oscillator are controlled in such a manner that only one oscillator is producing an output signal at a given time. Thus, if the transmitter or receiver is using the first band group, the first VCO is active. Correspondingly, if the transmitter or receiver is using the third band group, the second VCO is active.

The arrangement further comprises one or more dividers connected to the output of each oscillator, dividing the output signal of the oscillator until the frequency of both divided output signals is equal to the raster frequency.

In the specific example of FIG. 3, the output of the first VCO is connected to a first divider 306, which divides the frequency by 5. The output of the second VCO is connected to a divider 308 which divides the frequency by 9. The outputs of both dividers 306, 308, are connected to a third divider 310, which divides the signal at the input of the divider with 1.5. The frequency of the output signal 312 of the third divider 310 is the raster frequency fr 528 MHz.

The output signal 312 of the third divider 310 is provided to the digital part of the transmitter or receiver as a clock signal. The signal generated by the oscillator 300 or 302 is distorted in the dividers. Therefore, the output signal 312 of the third divider 310 is further taken to a low pass filter 314. The filter arrangement may be a passive low pass filter, but other realizations may be applied.

The frequency generator arrangement further comprises a single sideband mixer 316. The single sideband mixer 316 has as inputs signals from the outputs of the oscillators 300, 302 and the filter arrangement 314. The single sideband mixer 316 produces as output a signal 322 having a frequency which is equal to the frequency of the output signal of either one of the oscillators 300, 302 or to the frequency of the output signal of either one of the oscillators 300, 302 from which the output signal of the filter arrangement 314 has been subtracted or to which the output signal of the filter arrangement 314 has been added.

The frequency generator arrangement may further comprise a controller unit 320. The controller 320 controls the operation of the oscillators 300, 302 and the single sideband mixer 316. Depending on which band group is to be used, the controller activates either one of the oscillators 300, 302.

Let us assume as an example that the first band group is to be used. The controller 320 activates the first oscillator 300 and deactivates the second oscillator 302. Thus, the output signal of the first oscillator is taken through the dividers 306 and 310. The frequency of the output signal 312 of the third divider 310 is the raster frequency fr 528 MHz.

The output signal of the first oscillator is taken to the single sideband mixer 316. The frequency of this signal is 7.5*fr. Under the control of the controller unit 320 the single sideband mixer generates at its output a signal, whose frequency may be one of the following: 6.5*fr, 7.5*fr and 8.5*fr, i.e. the center frequencies of the bands of the first band group.

Respectively, let us assume as an example that the third band group is to be used. The controller 320 activates the second oscillator 302 and deactivates the first oscillator 300. Thus, the output signal of the first oscillator is taken through the dividers 308 and 310. The frequency of the output signal 312 of the third divider 310 is the raster frequency fr 528 MHz.

The output signal of the second oscillator 302 is taken to the single sideband mixer 316. The frequency of this signal is 13.5*fr. Under the control of the controller unit 320 the single sideband mixer generates at it's output a signal, whose frequency may be one of the following: 12.5*fr, 13.5*fr and 14.5*fr, i.e. the center frequencies of the bands of the third band group.

In the above embodiments, the single sideband mixer (SSB) 316 may have three states, −1, 0 and +1. In the state −1, the SSB selects a lower sideband, in the above examples either 6.5 fr or 12.5 fr. In the state +1, the SSB selects an upper sideband, in the above examples either 8.5 fr or 14.5 fr. In the state 0, the SSB selects the signal coming from the oscillator, in the above examples either 7.5 fr or 13.5 fr.

Figure 4:
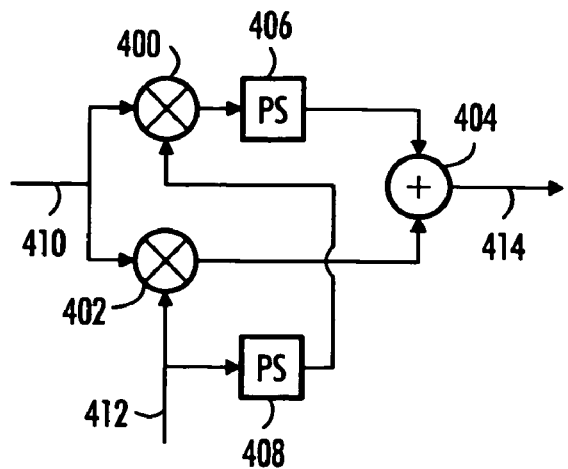
FIG. 4 illustrates an example of the structure of a single sideband mixer.

FIG. 4 illustrates an example of the operation of the single sideband mixer (SSB) 316. As such, the structure and operation of a SSB is known to one skilled in the art. The SSB is based on two parallel mixers, the first mixer 400 and the second mixer 402, and an adder 404. The SSB further comprises the two phase shifters 406, 408.

As an input to the SSB comes the output signal 410 of either one of the oscillators 300, 302. The signal 410 is connected to the mixers 400, 402. Another input signal to the SSB is the output signal 412 of the filter arrangement 314. This signal is taken to the second mixer 402 and through the phase shifter 408 to the first mixer 400. The output signal of the first mixer 400 is taken through the phase shifter 406 to the adder 404. The output signal of the second mixer 402 is taken directly to the adder 404;

The phase shift performed by the phase shifters may be either +90 or −90 degrees. By selecting the phase shift the output signal 414 of the SSB switches between the upper and lower sidebands. In other words, the SSB switches between states +1 and −1.

The 0-state may be realized by disabling the input signal 412 and either by biasing or grounding the other input port depending on the realization of the SBB; the SSB acts as an amplifier and produces the oscillator signal 410 at the output 414.

In practice, an SSB is usually realized with an RC polyphase filter.

The structure described in connection with FIG. 3 is merely an example of a possible realization of the proposed frequency generator, as one skilled in the art is aware. For example, the number of dividers 306 to 310 and the factors of dividers may be varied. In addition, the voltage-controlled oscillators 300, 302 may be inside the phase locked loop 304. The proposed solution is not limited to any particular raster frequency.

Figure 5:
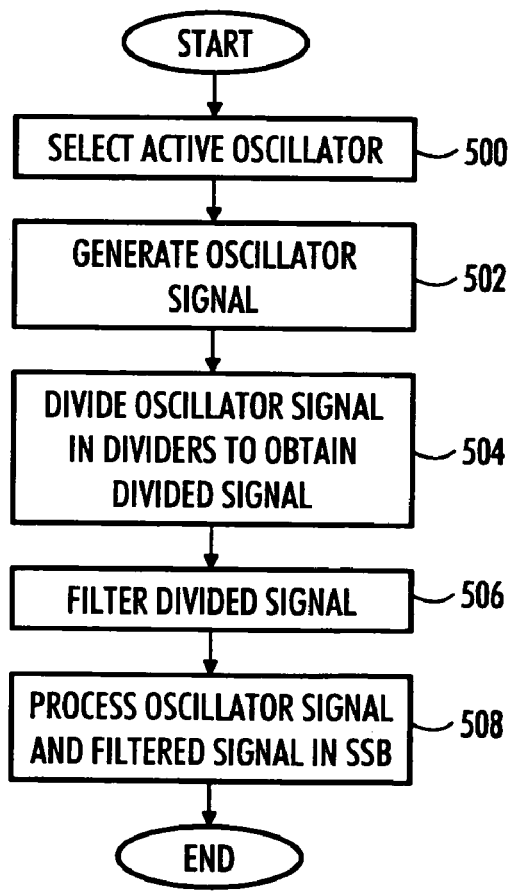
FIG. 5 illustrates an embodiment of the invention in a flowchart.

FIG. 5 illustrates an embodiment of the invention in a flowchart. In step 500, the active voltage controlled oscillator of the two voltage controlled oscillators 300, 302 is selected on the basis of the band group to be used. The other voltage controlled oscillator is disabled.

In step 502, an oscillator signal is generated in the selected voltage controlled oscillator, the frequency of the oscillator signal being a given multiple of a predetermined raster frequency.

In step 504, the output signal of the oscillator is divided in one or more dividers connected to the output of the selected oscillator until the frequency of the divided signal is equal to the raster frequency.

In step 506, low pass filtering is performed on the signal at the output of the one or more dividers in a filter arrangement.

In step 508, the output signals of the selected oscillator and the output signal of the filter arrangement are processed in a single sideband mixer. As output the mixer produced a signal having a frequency which is equal to the frequency of the output signal of the selected oscillator or to the frequency of the output signal of the selected oscillator from which the output signal of the filter arrangement has been subtracted or to which the output signal of the filter arrangement has been added.

Even though the invention has been described above with reference to an example according to the accompanying drawings, it is clear that the invention is not restricted thereto but it can be modified in several ways within the scope of the appended claims.

The invention claimed is:

1. A frequency generator arrangement, comprising
a first voltage controlled oscillator generating a first oscillator signal of a given multiple of a predetermined raster frequency,
a second voltage controlled oscillator generating a second oscillator signal of another given multiple of a predetermined raster frequency,
one or more dividers connected to the output of each oscillator, dividing the output signal of the oscillator until the frequency of both divided output signals is equal to the raster frequency,
a filter arrangement performing a low pass filtering on the signal at the output of the one or more dividers,
and a single sideband mixer, having as input the output signals of the oscillators and the output signal of the filter arrangement, the mixer producing as output a signal having a frequency which is equal to the frequency of the output signal of either one of the oscillators or to the frequency of the output signal of either one of the oscillators from which the output signal of the filter arrangement has been subtracted or to which the output signal of the filter arrangement has been added.

2. The frequency generator arrangement of claim 1, further comprising a controller configured to control the first and the second voltage controlled oscillator in such a manner that only one oscillator is producing an output signal at a time.

3. The frequency generator arrangement of claim 1, further comprising a controller configured to control the single sideband mixer to add the output signal of the filter arrangement to the output signal of either one of the oscillators or to subtract the output signal of the filter arrangement from the output signal of either one of the oscillators.

4. The frequency generator arrangement of claim 1, further comprising a controller configured to disable the input of the single sideband mixer receiving the output signal of the filter arrangement.

5. A radio transceiver comprising a frequency generator arrangement comprising
a first voltage controlled oscillator generating a first oscillator signal of a given multiple of a predetermined raster frequency,
a second voltage controlled oscillator generating a second oscillator signal of another given multiple of a predetermined raster frequency,
one or more dividers connected to the output of each oscillator, dividing the output signal of the oscillator until the frequency of both divided output signals is equal to the raster frequency,
a filter arrangement performing a low pass filtering on the signal at the output of the one or more dividers,
and a single sideband mixer, having as input the output signals of the oscillators and the output signal of the filter arrangement, the mixer producing as output a signal having a frequency which is equal to the frequency of the output signal of either one of the oscillators or to the frequency of the output signal of either one of the oscillators from which the output signal of the filter arrangement has been subtracted or to which the output signal of the filter arrangement has been added.

6. A method for generating frequencies, the method comprising:
generating a first oscillator signal in a first voltage controlled oscillator, the frequency of the first oscillator signal being a given multiple of a predetermined raster frequency,
generating a second oscillator signal in a second voltage controlled oscillator, the frequency of the second oscillator signal being another given multiple of a predetermined raster frequency,
dividing the output signal of each oscillator in one or more dividers connected to the output of each oscillator until the frequency of both divided output signals is equal to the raster frequency,
performing a low pass filtering on the signal at the output of the one or more dividers in a filter arrangement,
processing the output signals of the oscillators and the output signal of the filter arrangement in a single sideband mixer, the mixer producing as output a signal having a frequency which is equal to the frequency of the output signal of either one of the oscillators or to the frequency of the output signal of either one of the oscillators from which the output signal of the filter arrangement has been subtracted or to which the output signal of the filter arrangement has been added.

7. The method of claim 6, further comprising:
controlling the first and the second voltage controlled oscillator in such a manner that only one oscillator is producing an output signal at a time.

8. The method of claim 6, further comprising:
controlling the single sideband mixer to add the output signal of the filter arrangement to the output signal of either one of the oscillators or to subtract the output signal of the filter arrangement from the output signal of either one of the oscillators.

9. The method of claim 6, further comprising:
controlling the single sideband mixer to add the output signal of the filter arrangement to the output signal of either one of the oscillators or to subtract the output signal of the filter arrangement from the output signal of either one of the oscillators.

10. The method of claim 6, further comprising:
disabling the input of the single sideband mixer receiving the output signal of the filter arrangement.

11. A method for generating frequencies, the method comprising:
selecting a voltage controlled oscillator from at least two voltage controlled oscillators, on the basis of the band of frequencies to be generated, generating an oscillator signal in the selected voltage controlled oscillator, the frequency of the oscillator signal being a given multiple of a predetermined raster frequency, dividing the output signal of the oscillator in one or more dividers connected to the output of the oscillator until the frequency of the divided output signal is equal to the raster frequency, performing a low pass filtering on the signal at the output of the one or more dividers in a filter arrangement, processing the output signal of the oscillator and the output signal of the filter arrangement in a single sideband mixer, the mixer producing as output a signal having a frequency which is equal to the frequency of the output signal of the oscillator or to the frequency of the output signal of the oscillator from which the output signal of the filter arrangement has been subtracted or to which the output signal of the filter arrangement has been added.

* * * * *